United States Patent
Tong

(10) Patent No.: US 11,184,982 B2
(45) Date of Patent: Nov. 23, 2021

(54) DISPLAY PANEL AND CHIP-ON-FILM (COF) PACKAGE BONDING STRUCTURE, PANEL BONDING PINS, PACKAGE BONDING PINS, AND DISPLAY PANEL AND COF PACKAGE BONDING METHOD

(71) Applicant: WUHAN CHINA STAR OPTOELECTRONICS SEMICONDUCTOR DISPLAY TECHNOLOGY CO., LTD., Hubei (CN)

(72) Inventor: Peiqian Tong, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 581 days.

(21) Appl. No.: 16/092,337

(22) PCT Filed: Aug. 15, 2018

(86) PCT No.: PCT/CN2018/100698
§ 371 (c)(1),
(2) Date: Oct. 9, 2018

(87) PCT Pub. No.: WO2019/237496
PCT Pub. Date: Dec. 19, 2019

(65) Prior Publication Data
US 2021/0212213 A1    Jul. 8, 2021

(30) Foreign Application Priority Data
Jun. 15, 2018 (CN) .......................... 201810621832.3

(51) Int. Cl.
H05K 5/00 (2006.01)
H05K 7/00 (2006.01)
(Continued)

(52) U.S. Cl.
CPC ............. *H05K 1/181* (2013.01); *G06F 1/189* (2013.01); *H05K 2201/10128* (2013.01); *H05K 2201/10318* (2013.01)

(58) Field of Classification Search
CPC ......... H05K 1/181; H05K 2201/10128; H05K 2201/10318; G06F 1/189
See application file for complete search history.

(56) References Cited

U.S. PATENT DOCUMENTS

| 10,665,151 B2* | 5/2020 | Zhang ................... H05K 1/111 |
| 2015/0103500 A1* | 4/2015 | Bae .......................... H01L 24/06 361/749 |

(Continued)

FOREIGN PATENT DOCUMENTS

| CN | 106784376 A |   | 5/2017 |
| CN | 108022517   | * | 5/2018 |
| CN | 108022517 A |   | 5/2018 |

*Primary Examiner* — Yuriy Semenenko

(57) ABSTRACT

A display panel and chip-on-film (COF) package bonding structure is provided and includes a display panel including a panel substrate and a plurality of panel bonding pins. The panel bonding pins are disposed on the panel substrate and are arranged along a lateral direction. Each of the panel bonding pins is trapezoidal and is directed along a longitudinal direction. A COF package is bonded to the display panel and includes a package substrate and a plurality of package bonding pins. The package bonding pins are disposed on the package substrate, are arranged along the lateral direction, and are bonded to the panel bonding pins respectively. Each of the package bonding pins is trapezoidal (Continued)

and along the longitudinal direction. The trapezoidal panel bonding pins and package bonding pins can be aligned with and contacts each other.

7 Claims, 6 Drawing Sheets

(51) Int. Cl.
*H05K 1/18* (2006.01)
*G06F 1/18* (2006.01)

(56) References Cited

U.S. PATENT DOCUMENTS

| | | | |
|---|---|---|---|
| 2018/0047315 A1* | 2/2018 | Li | H01L 24/01 |
| 2019/0058028 A1* | 2/2019 | Won | H01L 51/56 |
| 2019/0123071 A1* | 4/2019 | Kim | H01L 24/06 |
| 2019/0139481 A1 | 5/2019 | Zhang et al. | |
| 2020/0100361 A1* | 3/2020 | Chen | H05K 1/118 |

* cited by examiner

| S01 — Providing step, comprising providing a display panel and a COF package, wherein: the display panel comprises panel substrate and a plurality of panel bonding pins, a panel bonding portion is formed on an end of the panel substrate, the panel bonding pins are disposed on the panel bonding portion and are arranged along a lateral direction of the panel bonding portion, and each of the panel bonding pins is trapezoidal, is tapered forward along a longitudinal direction of the panel bonding portion, and comprises a wide rear end portion and a narrow front end portion; and the COF package comprises a package substrate and a plurality of package bonding pins, a package bonding portion is formed on an end of the package substrate, the package bonding pins are disposed on the package bonding portion and are arranged along a lateral direction of the package bonding portion, each of the package bonding pins is trapezoidal, is tapered forward along a longitudinal direction of the package bonding portion, and comprises wide rear end part and a narrow front end part; |

↓

S02 — Aligning step, comprising aligning the package bonding pins of the COF package with the panel bonding pins of the display panel and making the package bonding pins of the COF package contact the panel bonding pins of the display panel, and confirming whether each of the package bonding pins of the COF package is aligned with and contacts each of the panel bonding pins of the display panel; if it is confirmed that each of the package bonding pins is aligned with and contacts each of the panel bonding pins, then implementing a next step; if it is confirmed that any one of the package bonding pins is not aligned with and does not contact a corresponding one of the panel bonding pins, shifting the package substrate relative to the panel substrate to make the package bonding pins contact the panel bonding pins respectively, then implementing the next step;

↓

S03 — Bonding step, comprising bonding the package bonding pins to the panel bonding pins respectively

FIG. 8

DISPLAY PANEL AND CHIP-ON-FILM (COF) PACKAGE BONDING STRUCTURE, PANEL BONDING PINS, PACKAGE BONDING PINS, AND DISPLAY PANEL AND COF PACKAGE BONDING METHOD

FIELD OF INVENTION

The present invention relates to a bonding structure, especially to a display panel and chip-on-film (COF) package bonding structure, panel bonding pins, package bonding pins, and a display panel and COF package bonding method. When excessive or insufficient expansion of the COF occurs during bonding of the display panel and the COF package, the display panel and COF package bonding structure can by shifting the COF bond bonding pins of the COF accurately to bonding pins of display panel such that bonding rate is improved.

BACKGROUND OF INVENTION

At present, demands for full screen displays in the markets becomes greater. Design of screen-to-body ratio for full screen displays is required to reduce an area of an outer lead bonding (OLB) region of a display panel as possible. To reduce the area of the OLB region, it becomes popular to bond an integrated circuits (IC) chip to a chip-on film (COF) package such that the COF package can be bonded to a display panel and then bent to a rear of the display panel such that a total arear of the font of display panel is efficiently decreased.

However, as pixel density (for example, pixel per inch, PPI) of the display panel becomes greater and the mechanical design of the COF package becomes smaller, a number of bonding pins between of the COF package and the display panel becomes larger, and requirement to precision of bonding process is getting higher. Even though the pins of the COF package are designed to be narrowed and closer under consideration of expansion factor of the COF package during the bonding process, the COF package may still excessively expand or insufficiently expand during the bonding process and causes the COF package not bonded correctly to the display panel and results in failure of the bonding process.

Therefore, it is necessary to provide a display panel and COF package bonding structure to solve issues of the conventional technology.

SUMMARY OF INVENTION

The main objective of the present invention is to provide a display panel and chip-on-film (COF) package bonding structure, panel bonding pins, package bonding pins, and a display panel and COF package bonding method. When excessive or insufficient expansion of the COF occurs during bonding of the display panel and the COF package, the display panel and COF package bonding structure can by shifting the COF bond bonding pins of the COF accurately to bonding pins of display panel such that bonding rate is improved.

To achieve the above objective of the present invention, the present invention provides a display panel and COF package bonding structure, including:

a display panel comprising a panel substrate and a plurality of panel bonding pins, a panel bonding portion formed on an end of the panel substrate, the panel bonding pins disposed on the panel bonding portion and arranged along a lateral direction of the panel bonding portion, and each of the panel bonding pins being trapezoidal and directed along a longitudinal direction of the panel bonding portion; and a COF package bonded to the display panel and comprising a package substrate and a plurality of package bonding pins, a package bonding portion formed on an end of the package substrate, the package bonding pins disposed on the package bonding portion, arranged along a lateral direction of the package bonding portion and bonded to the panel bonding pins respectively, and each of the package bonding pins being trapezoidal, directed along a longitudinal direction of the package bonding portion and configured to be in an opposite direction relative to each of the panel bonding pins;

wherein each of the panel bonding pins is trapezoidal, is tapered forward along the longitudinal direction of the panel bonding portion, and comprises a wide rear end portion and a narrow front end portion; and each of the package bonding pins is trapezoidal, is tapered forward along the longitudinal direction of the package bonding portion, and comprises a wide rear end part and a narrow front end part;

wherein when the bonding pins are aligned with the package bonding pins respectively, in each of the panel bonding pins and each of the package bonding pins that is bonded to the panel bonding pin, the wide rear end part is overlaid by the narrow front end portion, and the wide rear end portion overlays the narrow front end part;

wherein when the panel bonding pins and the package bonding pins are misaligned, each of the package bonding pins is configured to shift along the longitudinal direction of the package bonding portion forward to each of the panel bonding pins such that the wide rear end part of each of the package bonding pins is partially overlaid by each of the panel bonding pins and the wide rear end portion of each of the panel bonding pins partially overlays each of the package bonding pins.

In comparison with the prior art, the display panel and COF package bonding structure of the present invention employing the trapezoidal panel bonding pins on the display panel and the trapezoidal package bonding pins of the COF package is capable of shifting the COF package relative to the display panel when the COF package is excessively or insufficiently expanded during its bonding to the display panel such that alignment and contact between each of the package bonding pins and a corresponding panel bonding pin. Therefore, the present invention prevents misalignment and bonding failure due to excessive or insufficient expansion of the COF package and increases yield rate of the bonding process.

Another objective of the present invention is to provide a display panel and COF package bonding structure, including:

a display panel comprising a panel substrate and a plurality of panel bonding pins, a panel bonding portion formed on an end of the panel substrate, the panel bonding pins disposed on the panel bonding portion and arranged along a lateral direction of the panel bonding portion, and each of the panel bonding pins being trapezoidal and directed along a longitudinal direction of the panel bonding portion; and a COF package bonded to the display panel and comprising a package substrate and a plurality of package bonding pins, a package bonding portion formed on an end of the package substrate, the package bonding pins disposed on the package bonding portion, arranged along a lateral direction of the package bonding portion and bonded to the panel bonding pins respectively, and each of the package bonding pins being trapezoidal, directed along a longitudinal direction of the package bonding portion and configured to be in an opposite direction relative to each of the panel bonding pins.

In the present invention, each of the panel bonding pins is trapezoidal, is tapered forward along the longitudinal direction of the panel bonding portion, and comprises a wide rear end portion and a narrow front end portion; and each of the package bonding pins is trapezoidal, is tapered forward along the longitudinal direction of the package bonding portion, and comprises a wide rear end part and a narrow front end part.

In the present invention, when the bonding pins are aligned with the package bonding pins respectively, in each of the panel bonding pins and each of the package bonding pins that is bonded to the panel bonding pin, the wide rear end part is overlaid by the narrow front end portion, and the wide rear end portion overlays the narrow front end part.

In the present invention, when the panel bonding pins and the package bonding pins are misaligned, each of the package bonding pins shifts along the longitudinal direction of the package bonding portion forward to each of the panel bonding pins such that the wide rear end part of each of the package bonding pins is partially overlaid by each of the panel bonding pins and the wide rear end portion of each of the panel bonding pins partially overlays each of the package bonding pins.

In the present invention, a width of the wide rear end portion of each of the panel bonding pins is three times a width of the narrow front end portion, and an interval of adjacent two of the panel bonding pins two times the width of the narrow front end portion.

In the present invention, a width of the wide rear end part of each of the package bonding pins is three times a width of the narrow front end part, and an interval of adjacent two of the package bonding pins is two times the width of the narrow front end part.

In the present invention, size and shape of each of the panel bonding pins are substantially the same as size and shape of each of the package bonding pins.

Another objective of the present invention is to provide a panel bonding pins configured to be disposed on a panel substrate of a display panel, and the panel bonding pin is trapezoidal and comprises a wide rear end portion and a narrow front end portion.

In the present invention, a width of the wide rear end portion is three times a width of the narrow front end portion.

Another objective of the present invention is to provide a package bonding pins configured to be disposed on a package substrate of a COF package, and the package bonding pin is trapezoidal and comprises a wide rear end part and a narrow front end part.

In the present invention, a width of the wide rear end part is three times a width of the narrow front end part.

Still another objective of the present invention is to provide a display panel and COF package bonding method including:

a providing step comprising providing a display panel and a COF package, wherein:

the display panel comprises panel substrate and a plurality of panel bonding pins, a panel bonding portion is formed on an end of the panel substrate, the panel bonding pins are disposed on the panel bonding portion and are arranged along a lateral direction of the panel bonding portion, and each of the panel bonding pins is trapezoidal, is tapered forward along a longitudinal direction of the panel bonding portion, and comprises a wide rear end portion and a narrow front end portion; and the COF package comprises a package substrate and a plurality of package bonding pins, a package bonding portion is formed on an end of the package substrate, the package bonding pins are disposed on the package bonding portion and are arranged along a lateral direction of the package bonding portion, each of the package bonding pins is trapezoidal, is tapered forward along a longitudinal direction of the package bonding portion, and comprises wide rear end part and a narrow front end part; and an aligning step comprising aligning the package bonding pins of the COF package with the panel bonding pins of the display panel and making the package bonding pins of the COF package contact the panel bonding pins of the display panel, and confirming whether each of the package bonding pins of the COF package is aligned with and contacts each of the panel bonding pins of the display panel; if it is confirmed that each of the package bonding pins is aligned with and contacts each of the panel bonding pins, then implementing a next step; if it is confirmed that any one of the package bonding pins is not aligned with and does not contact a corresponding one of the panel bonding pins, shifting the package substrate relative to the panel substrate to make the package bonding pins contact the panel bonding pins respectively, then implementing the next step; and a bonding step, the above next step, comprising bonding the package bonding pins to the panel bonding pins respectively.

In the present invention, in the aligning step, a shifting direction of the package substrate relative to the panel substrate is at least along the longitudinal direction of the package bonding portion.

To allow the above content of the present invention to be more clearly understood, the following is a detailed description of the preferred embodiment in conjunction with the accompanying drawings.

DESCRIPTION OF DRAWINGS

FIG. 8 is a flowchart of a display panel and COF package bonding method in accordance with the present invention.

DETAILED DESCRIPTION OF PREFERRED EMBODIMENTS

Figure 1:
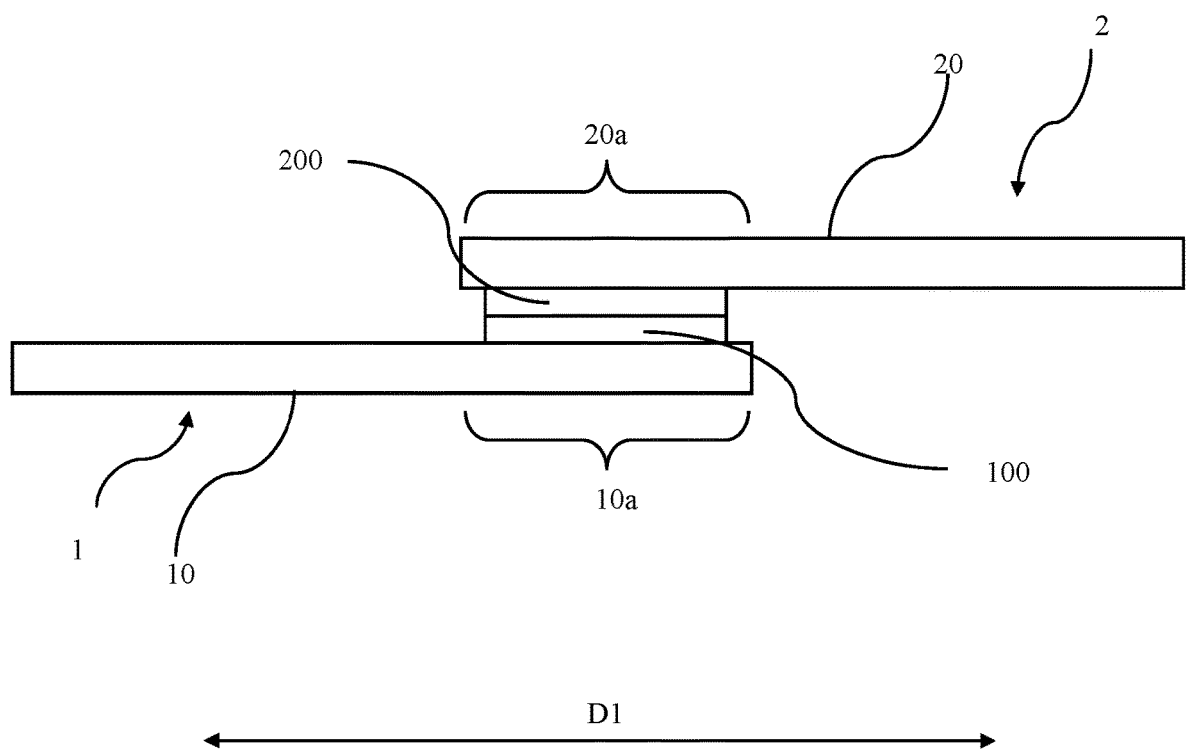
FIG. 1 is a schematic side view of a display panel and chip-on-film (COF) package bonding structure in accordance with the present invention.
Figure 2:
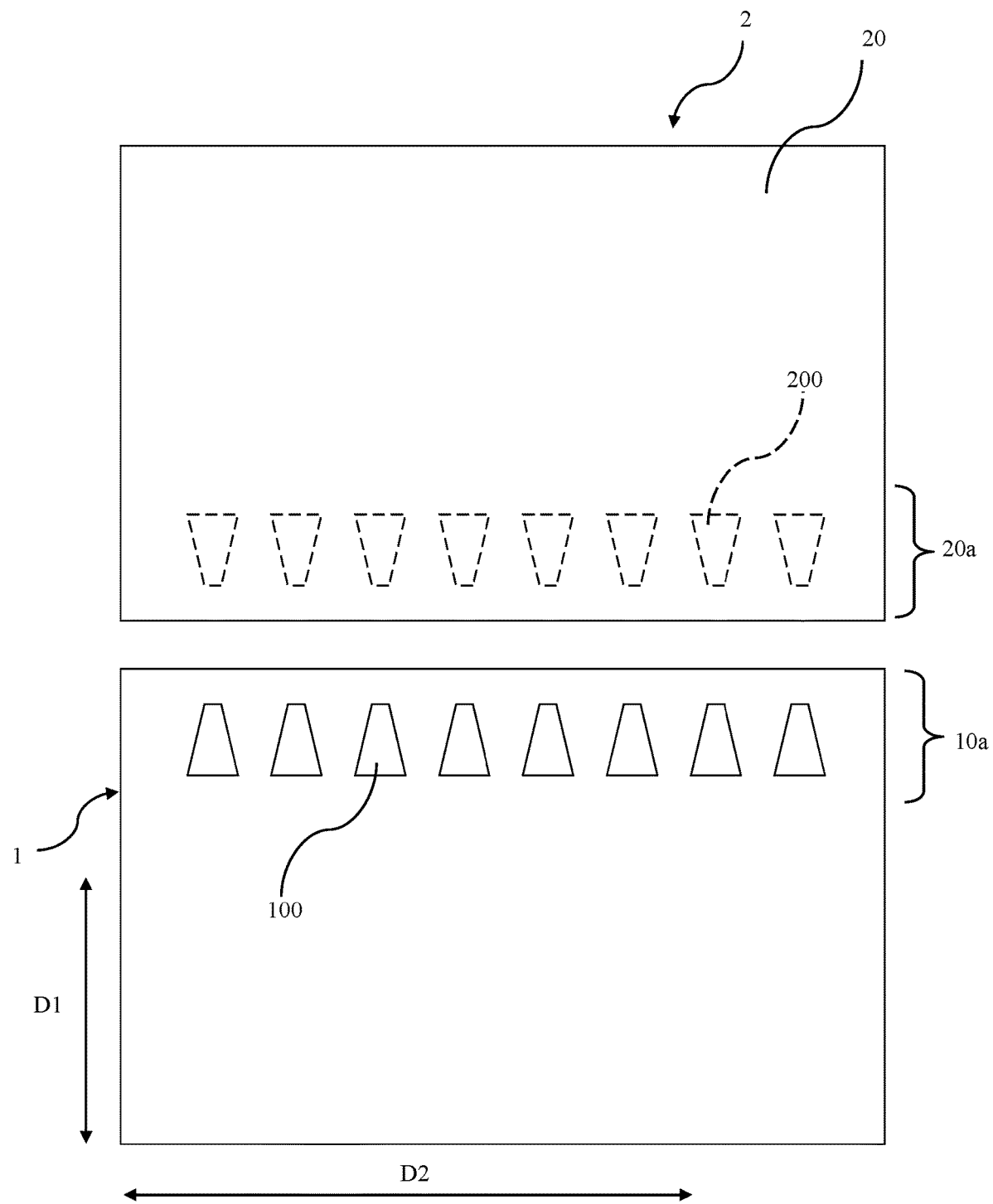
FIG. 2 is a schematic top view of the display panel and COF package bonding structure of the present invention before a bonding process.

With reference to FIGS. 1 and 2, a bonding structure of a display panel and a chip-on-film (COF) package includes: a display panel 1 and a COF package 2.

Figure 3:
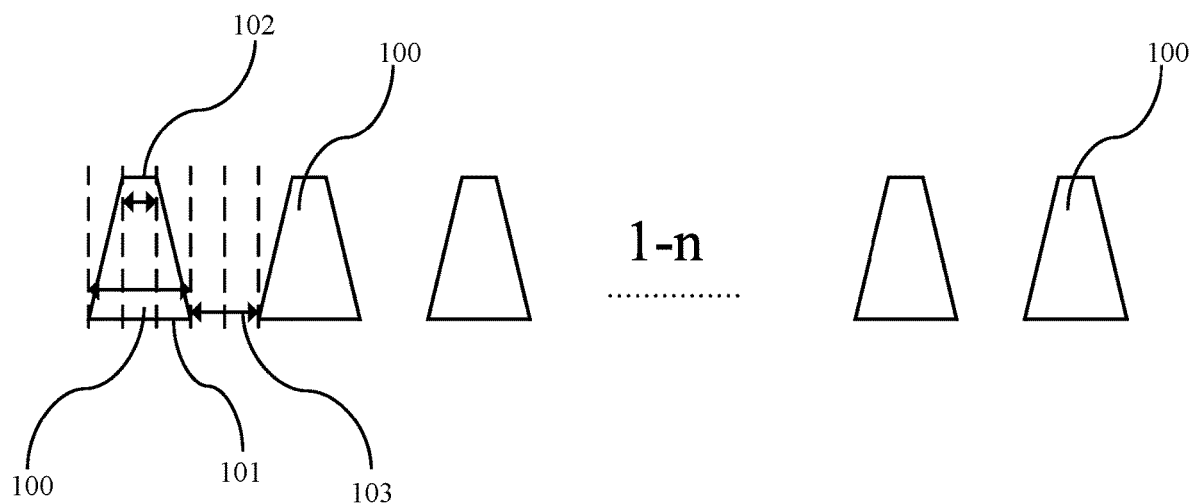
FIG. 3 is a schematic top view of an arrangement of panel bonding pins of the present invention.

With reference to FIG. 3, the display panel 1 include a panel substrate 10 and a plurality of panel bonding pins 100.

A panel bonding portion 10a is formed on an end of the panel substrate 10. The panel bonding pins 100 are disposed on the panel bonding portion 10a and are arranged along a lateral direction D2 of the panel bonding portion 10a. "1-n" shown in FIG. 3 means that a number of the panel bonding pins 100 is n. Each of the panel bonding pins 100 is trapezoidal, is directed along a longitudinal direction D1 of the panel bonding portion 10a, is tapered forward (tapered toward the COF package 2), and includes a wide rear end portion 101 and a narrow front end portion 102 opposite to the wide rear end portion 101. Furthermore, a width of the wide rear end portion 101 is three times a width of the narrow front end portion 102, and an interval 103 of adjacent two of the panel bonding pins 100 is two times the width of the narrow front end portion 102.

Figure 4:
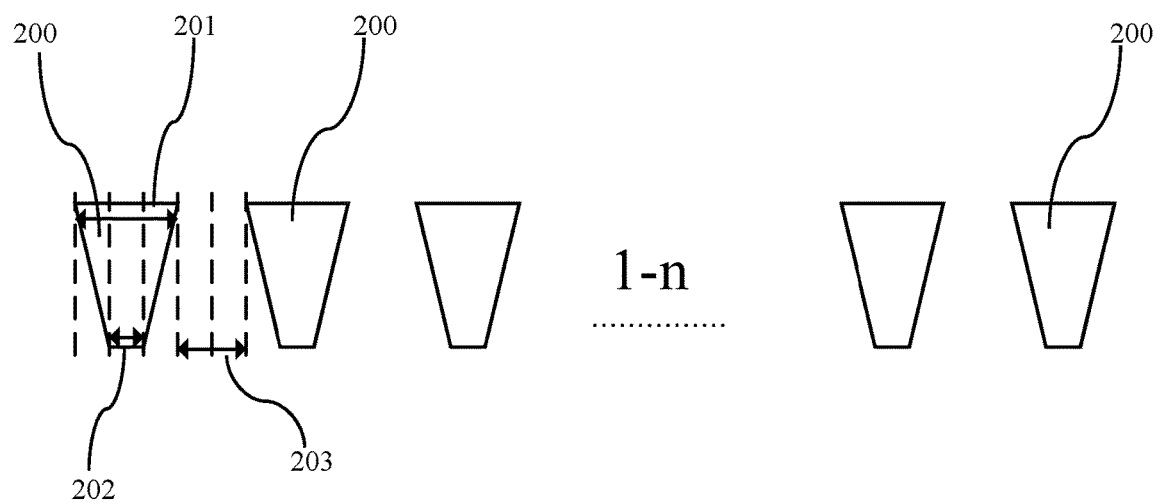
FIG. 4 is a schematic top view of an arrangement of package bonding pins of the present invention.
Figure 5:
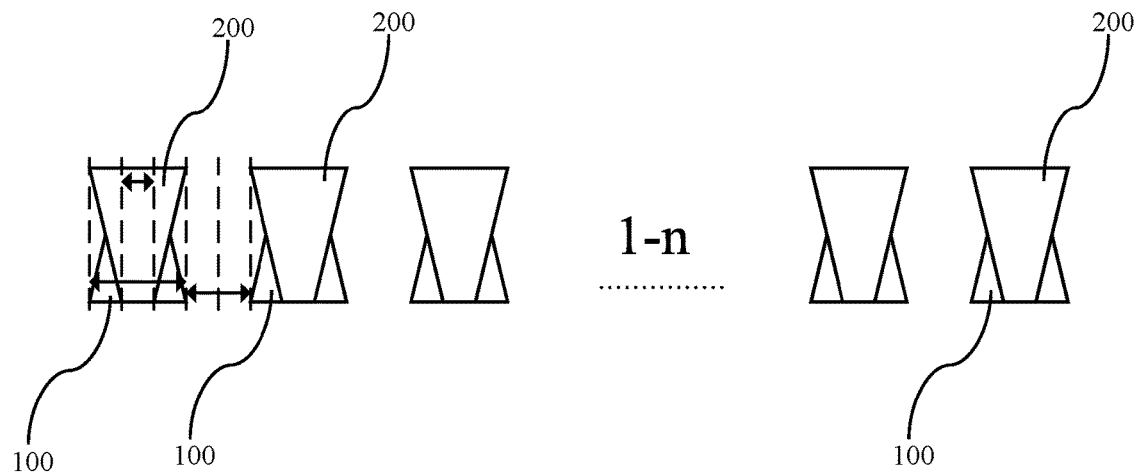
FIG. 5 is a schematic top view of the present invention during the bonding process, wherein when the COF package is sufficiently expanded such that the panel bonding pins are aligned with and bonded to the package bonding pins respectively.

With reference to FIGS. 4 and 5, the COF package 2 is bonded to the display panel 1 and includes a package substrate 20 and a plurality of package bonding pins 200.

A package bonding portion 20a is formed on an end of the package substrate 20. The package bonding pins 200 are disposed on the package bonding portion 20a, are arranged along a lateral direction D2 of the package bonding portion 20a, and are bonded to the panel bonding pins 100 respectively. "1-n" shown in FIG. 4 means that a number of the package bonding pins 200 is n. Each of the package bonding pins 200 is trapezoidal, is directed along a longitudinal direction D1 of the package bonding portion 20a, is tapered forward (tapered toward the display panel 1), and includes a wide rear end part 201 and a narrow front end part 202 opposite to the wide rear end part 201. During a bonding procedure, when the panel bonding pins 100 are aligned with the package bonding pins 200, in each of the panel bonding pins 100 and each of the package bonding pins 200 that is bonded to the panel bonding pin 100, the wide rear end part 201 is overlaid by the narrow front end portion 102, and the wide rear end portion 101 overlays the narrow front end part 202, as shown in FIG. 4. When the panel bonding pins 100 and the package bonding pins are misaligned, each of the package bonding pins 200 further shifts along the longitudinal direction of the package bonding portion 200 forward to each of the panel bonding pins 100 such that the wide rear end part 201 of each of the package bonding pins 200 is partially overlaid by each of the panel bonding pins 100 and the wide rear end portion 101 of each of the panel bonding pins 100 partially overlays each of the package bonding pins 200, as show in FIG. 5. Furthermore, a width of the wide rear end part 201 is three times a width of the narrow front end part 202, and an interval 203 of adjacent two of the package bonding pins 200 is two times the width of the narrow front end part 202.

In the present invention, size and shape of each of the panel bonding pins 100 is the same as size and shape of each of the package bonding pins 200.

With reference to FIG. 8, a bonding method for a display panel 1 and a COF package 2 in accordance with present invention includes: a providing step S01, an aligning step S02, and a bonding step S03.

As shown in FIGS. 3 and 4, the providing step S01 includes providing the above display panel 1 and the above COF package 2. In the providing step S01, the display panel 1 and the COF package 2 are not bonded yet.

Figure 6:
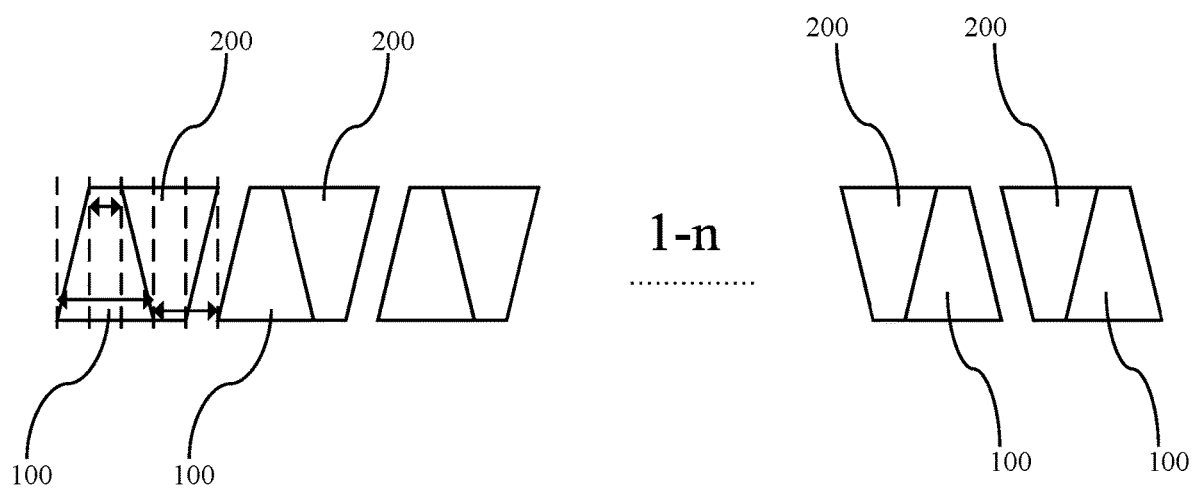
FIG. 6 is a schematic top view of the present invention during the bonding process, wherein the COF package is insufficiently expanded such that the arrangement of the package bonding pins is entirely contracted inward to a center of the arrangement and decreases an interval of adjacent package bonding pins to make the panel bonding pins misaligned with and failing to be correctly bonded to the package bonding pins.

The aligning step S02 includes aligning the package bonding pins 200 of the COF package 2 with the panel bonding pins 100 of the display panel 1 and making the package bonding pins 200 of the COF package 2 contact the panel bonding pins 100 of the display panel 1, and confirming whether each of the package bonding pins 200 of the COF package 2 is aligned with and contacts each of the panel bonding pins 100 of the display panel 1. If it is confirmed that each of package bonding pins 200 is aligned with and contacts each of the panel bonding pins 100, as shown in FIG. 5, then a next step is implemented. With reference to FIG. 6, under a condition that the interval of the adjacent package bonding pins 200 is larger or smaller due to excessive or insufficient expansion of the COF package 2 (the expansion means that the package substrate 20 is expanded due to high temperature of the bonding process), the package bonding pins 200 cannot be completely aligned with the panel bonding pins 100.

Figure 7:
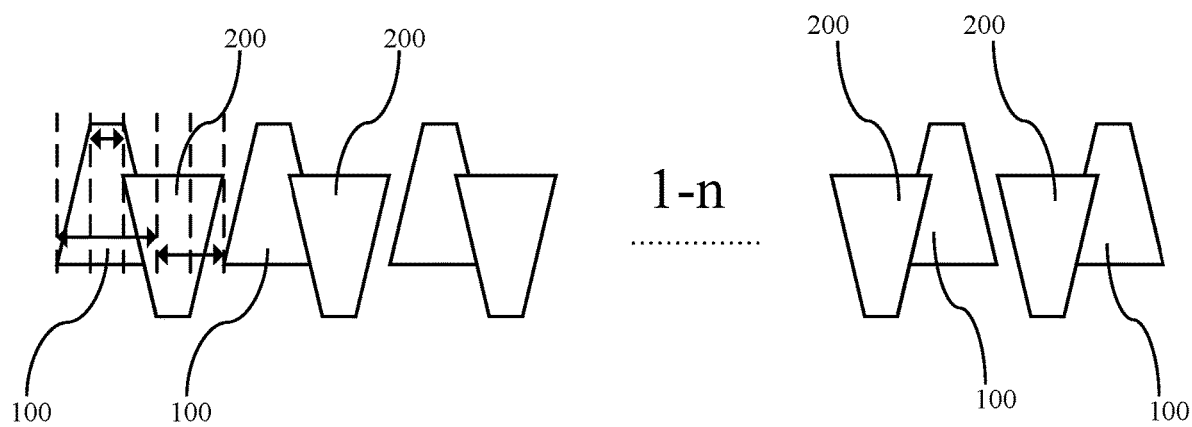
FIG. 7 is a schematic top view of the present invention in FIG. 60, wherein under the condition of the insufficiently expanded COF package, the package substrate of the COF package is further shifted along a direction toward the panel substrate of the display panel such that wider parts of the package bonding pins contact wider portions of the panel bonding pins respectively and make the package bonding pins correctly bonded to the panel bonding pins.

With reference to FIG. 7, If it is confirmed that any one of the package bonding pins 200 is not aligned with and does not contact a corresponding one of the panel bonding pins 100, the panel substrate 10 is shifted relative to the package substrate 20 to make each of the package bonding pins 200 contact each of the panel bonding pins 100, then the next step is implemented. Furthermore, in the aligning step S02, a shifting direction of the package substrate 20 relative to the panel substrate 10 is at least along the longitudinal direction D1 of the package bonding portion 20a, but can also be along the longitudinal direction D1 and the lateral direction D2 simultaneously.

The bonding step S03, the above "next step", includes bonding the package bonding pins 200 to the panel bonding pins 100 respectively. The bonding method can employ soldering material such as solder.

In comparison with the prior art, the display panel 1 and the COF package 2 of the present invention employing the trapezoidal panel bonding pins 100 on the display panel 1 and the trapezoidal package bonding pins 200 on the COF package 2 is capable of shifting the COF package 2 relative to the display panel 1 when the COF package 2 is excessively or insufficiently expanded during its bonding to the display panel 1 such that alignment and contact between each of the package bonding pins 200 and a corresponding panel bonding pin 100. Therefore, the present invention prevents misalignment and bonding failure due to excessive or insufficient expansion of the COF package 2 and increases yield rate of the bonding process.

What is claimed is:

1. A display panel and chip-on-film (COF) package bonding structure, comprising:
    a display panel comprising a panel substrate and a plurality of panel bonding pins, a panel bonding portion formed on an end of the panel substrate, the panel bonding pins disposed on the panel bonding portion and arranged along a lateral direction of the panel bonding portion, each of the panel bonding pins being trapezoidal and directed along a longitudinal direction of the panel bonding portion; and a COF package bonded to the display panel and comprising a package substrate and a plurality of package bonding pins, a package bonding portion formed on an end of the package substrate; the package bonding pins disposed on the package bonding portion, arranged along a lateral direction of the package bonding portion, and bonded to the panel bonding pins respectively; and each of the package bonding pins being trapezoidal, directed along a longitudinal direction of the package bonding portion, and directed oppositely to an orientation of each of the panel bonding pins;

wherein each of the panel bonding pins is trapezoidal and tapered forward along the longitudinal direction of the panel bonding portion, and comprises a wide rear end portion and a narrow front end portion; and each of the package bonding pins is trapezoidal and tapered forward along the longitudinal direction of the package bonding portion, and comprises a wide rear end part and a narrow front end part;

wherein when the panel bonding pins are aligned with the package bonding pins respectively, in each of the panel bonding pins and each of the package bonding pins that is bonded to the panel bonding pin, the wide rear end part is overlaid by the narrow front end portion, and the wide rear end portion overlays the narrow front end part; and wherein when the panel bonding pins and the package bonding pins are misaligned, each of the package bonding pins is configured to shift along the longitudinal direction of the package bonding portion forward to each of the panel bonding pins such that the wide rear end part of each of the package bonding pins partially is overlaid by each of the panel bonding pins and the wide rear end portion of each of the panel bonding pins partially overlays each of the package bonding pins.

2. A display panel and chip-on-film (COF) package bonding structure, comprising:

a display panel comprising a panel substrate and a plurality of panel bonding pins, a panel bonding portion formed on an end of the panel substrate, the panel bonding pins disposed on the panel bonding portion and arranged along a lateral direction of the panel bonding portion, and each of the panel bonding pins being trapezoidal and directed along a longitudinal direction of the panel bonding portion; and a COF package bonded to the display panel and comprising a package substrate and a plurality of package bonding pins, a package bonding portion formed on an end of the package substrate, the package bonding pins disposed on the package bonding portion, arranged along a lateral direction of the package bonding portion and bonded to the panel bonding pins respectively, and each of the package bonding pins being trapezoidal, directed along a longitudinal direction of the package bonding portion and configured to be in an opposite direction relative to each of the panel bonding pins;

wherein each of the panel bonding pins is trapezoidal, is tapered forward along the longitudinal direction of the panel bonding portion, and comprises a wide rear end portion and a narrow front end portion;

wherein each of the package bonding pins is trapezoidal, is tapered forward along the longitudinal direction of the package bonding portion, and comprises a wide rear end part and a narrow front end part; and wherein when the panel bonding pins and the package bonding pins are misaligned, each of the package bonding pins is configured to shift along the longitudinal direction of the package bonding portion forward to each of the panel bonding pins such that the wide rear end part of each of the package bonding pins is partially overlaid by each of the panel bonding pins and the wide rear end portion of each of the panel bonding pins partially overlays each of the package bonding pins.

3. The display panel and COF package bonding structure as claimed in claim 2, wherein when the panel bonding pins are aligned with the package bonding pins respectively, in each of the panel bonding pins and each of the package bonding pins that is bonded to the panel bonding pin, the wide rear end part is overlaid by the narrow front end portion, and the wide rear end portion overlays the narrow front end part.

4. The display panel and COF package bonding structure as claimed in claim 2, wherein a width of the wide rear end portion of each of the panel bonding pins is three times a width of the narrow front end portion, and an interval of adjacent two of the panel bonding pins two times the width of the narrow front end portion.

5. The display panel and COF package bonding structure as claimed in claim 2, wherein a width of the wide rear end part of each of the package bonding pins is three times a width of the narrow front end part, and an interval of adjacent two of the package bonding pins is two times the width of the narrow front end part.

6. The display panel and COF package bonding structure as claimed in claim 2, wherein: size and shape of each of the panel bonding pins are the same as size and shape of each of the package bonding pins.

7. A display panel and chip-on-film (COF) package bonding method, comprising:

a providing step comprising providing a display panel and a COF package, wherein:

the display panel comprises panel substrate and a plurality of panel bonding pins, a panel bonding portion is formed on an end of the panel substrate, the panel bonding pins are disposed on the panel bonding portion and are arranged along a lateral direction of the panel bonding portion, and each of the panel bonding pins is trapezoidal, is tapered forward along a longitudinal direction of the panel bonding portion, and comprises a wide rear end portion and a narrow front end portion; and the COF package comprises a package substrate and a plurality of package bonding pins, a package bonding portion is formed on an end of the package substrate, the package bonding pins are disposed on the package bonding portion and are arranged along a lateral direction of the package bonding portion, each of the package bonding pins is trapezoidal, is tapered forward along a longitudinal direction of the package bonding portion, and comprises wide rear end part and a narrow front end part; and an aligning step comprising aligning the package bonding pins of the COF package with the panel bonding pins of the display panel and making the package bonding pins of the COF package contact the panel bonding pins of the display panel, and confirming whether each of the package bonding pins of the COF package is aligned with and contacts each of the panel bonding pins of the display panel; if it is confirmed that each of the package bonding pins is aligned with and contacts each of the panel bonding pins, then implementing a next step; if it is confirmed that any one of the package bonding pins is not aligned with and does not contact a corresponding one of the panel bonding pins, shifting the package substrate relative to the panel substrate to make the package bonding pins contact the panel bonding pins respectively, then implementing the next step; and a bonding step, comprising bonding the package bonding pins to the panel bonding pins respectively;

wherein in the aligning step, a shifting direction of the package substrate relative to the panel substrate is at least along the longitudinal direction of the package bonding portion.

* * * * *